(12) United States Patent
Hille

(10) Patent No.: US 9,292,009 B2
(45) Date of Patent: Mar. 22, 2016

(54) FURNITURE HAVING AN ELECTROMOTIVE ADJUSTMENT MEANS

(75) Inventor: Armin Hille, Bielefeld (DE)

(73) Assignee: DEWERTOKIN GMBH, Kirchlengern (DE)

( * ) Notice: Subject to any disclaimer, the term of this patent is extended or adjusted under 35 U.S.C. 154(b) by 731 days.

(21) Appl. No.: 13/696,477

(22) PCT Filed: May 6, 2011

(86) PCT No.: PCT/EP2011/057308
§ 371 (c)(1),
(2), (4) Date: May 1, 2013

(87) PCT Pub. No.: WO2011/141375
PCT Pub. Date: Nov. 17, 2011

(65) Prior Publication Data
US 2013/0207585 A1 Aug. 15, 2013

(30) Foreign Application Priority Data
May 8, 2010 (DE) ...................... 20 2010 005 416 U

(51) Int. Cl.
*H02P 3/00* (2006.01)
*G05D 9/00* (2006.01)
(Continued)

(52) U.S. Cl.
CPC ............... *G05B 9/02* (2013.01); *A47C 20/041* (2013.01); *A47C 20/08* (2013.01); *H03K 17/941* (2013.01); *H03K 2217/94108* (2013.01)

(58) Field of Classification Search
CPC ........ A47C 20/041; A47C 20/08; G05B 9/02; H03K 2217/94108; H03K 17/941
USPC .................. 318/120, 480; 5/616; 700/275
See application file for complete search history.

(56) References Cited

U.S. PATENT DOCUMENTS

| 2001/0013715 A1* | 8/2001 | Schunke | ............... A47C 7/506 297/85 M |
| 2003/0052238 A1* | 3/2003 | Schneider | ............ A47C 20/08 248/157 |

(Continued)

FOREIGN PATENT DOCUMENTS

| CN | 101299947 A | 11/2008 |
| DE | 201 19 111 | 3/2002 |

(Continued)

OTHER PUBLICATIONS

German Office Action for Application No. 20 2010 005 416.8, dated May 8, 2010.

(Continued)

*Primary Examiner* — Eduardo Colon Santana
*Assistant Examiner* — Gabriel Agared
(74) *Attorney, Agent, or Firm* — Thomas, Karceski & Karmilovich, PC

(57) ABSTRACT

An electromotive adjustment device for a piece of furniture having an adjustable furniture part. The electromotive adjustment device includes a housing, a drive gear motor, a control device having a device housing, and at least one drive unit having an output member connected to the adjustable furniture part. The drive gear motor is configured to be one of brought to a standstill and reversed by a safety device during the occurrence of a pinching between one or more of two furniture parts, a furniture part and a component, and a furniture part and a part of a person's body. The safety device includes a light transmitter configured such that a light beam directed against one of the adjustable furniture part and the component and the light beam is reflected to meet a light receiver.

23 Claims, 1 Drawing Sheet

| 10 | table board |
| 11 | housing |
| 12 | light transmitter |
| 13 | light receiver |
| 14 | light guide channel |
| 15 | light guide channel |
| 16 | output member |
| 17 | drive unit having an output member connected to the adjustable furniture part |
| 18 | drive gear motor |
| 19 | control device having a device housing |

(51) Int. Cl.
*A47B 7/02* (2006.01)
*G05B 9/02* (2006.01)
*A47C 20/04* (2006.01)
*A47C 20/08* (2006.01)
*H03K 17/94* (2006.01)

(56) References Cited

U.S. PATENT DOCUMENTS

| | | | | |
|---|---|---|---|---|
| 2005/0061096 A1* | 3/2005 | Dewert | ................ | A47C 20/041 74/421 A |
| 2006/0130236 A1* | 6/2006 | Dewert | ................ | A47C 1/0242 5/616 |
| 2007/0152477 A1* | 7/2007 | Schneider | ............ | A47C 1/0242 297/71 |
| 2007/0285035 A1* | 12/2007 | Roither | .................... | H02K 7/06 318/120 |
| 2010/0096553 A1 | 4/2010 | Patil et al. | | |
| 2010/0224017 A1* | 9/2010 | Nielsen | ................ | A47C 20/041 74/89.23 |
| 2012/0047647 A1* | 3/2012 | Steers | .................. | A47C 27/082 5/13 |
| 2012/0068635 A1* | 3/2012 | Koch | ...................... | H02P 6/001 318/135 |
| 2013/0289770 A1* | 10/2013 | Rawls-Meehan | ...... | G05B 15/02 700/275 |

FOREIGN PATENT DOCUMENTS

| | | |
|---|---|---|
| DE | 202 07 619 | 9/2002 |
| EP | 1 125 525 | 8/2001 |
| WO | 2007/124748 | 11/2007 |

OTHER PUBLICATIONS

Chinese Office Action dated Mar. 7, 2014, in corresponding Chinese Patent Application No. 201180023059.7.

* cited by examiner

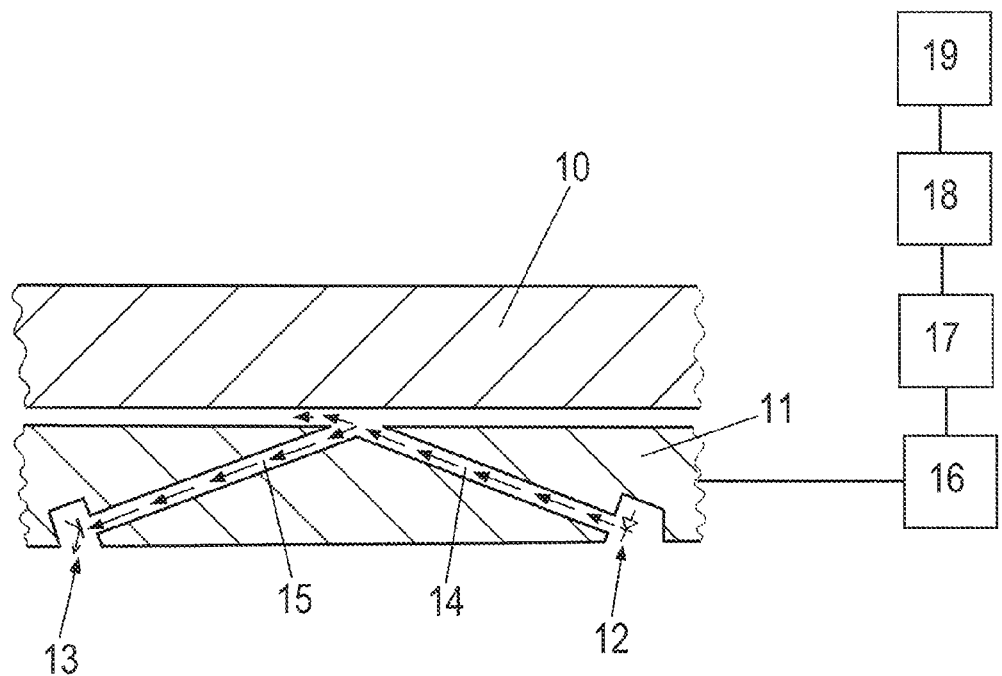
| 10 | table board |
| 11 | housing |
| 12 | light transmitter |
| 13 | light receiver |
| 14 | light guide channel |
| 15 | light guide channel |
| 16 | output member |
| 17 | drive unit having an output member connected to the adjustable furniture part |
| 18 | drive gear motor |
| 19 | control device having a device housing |

FURNITURE HAVING AN ELECTROMOTIVE ADJUSTMENT MEANS

CROSS-REFERENCE TO RELATED APPLICATION

This application is a national stage of International Application PCT/EP2011/057308, filed May 6, 2011, and claims benefit of and priority to German Patent Application No. 20 2010 005 416.8, filed May 8, 2010, the content of which Applications are incorporated by reference herein.

BACKGROUND AND SUMMARY

The present disclosure relates to an electromotive adjustment device for a piece of furniture, the piece of furniture including one or more adjustable furniture parts. The electromotive adjustment device includes a housing, at least one drive gear motor, a control device and a drive unit, the output member of which is connected to a furniture component of the piece of furniture to be adjusted or to an input member of an adjustment fitting. A safety device is provided by which the drive gear motor can be brought to a standstill and/or reversed during pinching between operatively connected furniture parts or between a furniture part and another component or between a furniture part and a part of a body.

An electromotive adjustment device is known in many embodiments. A specific embodiment depends on the type of the furniture to be adjusted, for example, a slatted base, a hospital or nursing bed, or seat and reclining furniture, or the height adjustment of a table board.

Since the adjusting speeds of the furniture parts to be adjusted are relatively low, the gear of the drive gear motor is a speed-reduction gear, for example, in the form of a worm drive. The drive motor of the gear motor is a DC motor to be driven with a safe DC voltage. The drive unit to be driven by the gear motor may be a spindle drive, for example, wherein either the spindle is rotatably driveable and a spindle nut, which is placed thereon and which is secured against rotation and will be displaced in the longitudinal direction of the spindle when the drive gear motor is activated, or conversely the spindle is secured against rotation and will displace in the longitudinal direction, and the spindle nut will be rotated. The output member of the drive unit is rigidly connected with the linearly movable gear component. This can be a lifting tube, for example, which comprises a fork head at the free end, which is connected in an articulated manner to the furniture part to be adjusted or to the input member of an adjustable fitting.

Such adjustment devices are known as single or double drives. In the case of single drives, a drive unit is coupled with the drive gear motor, whereas in the case of a double drive drive units are provided which are coupled with a gear motor or with two gear motors and which are arranged in a common housing.

Other adjustment devices are known as so-called lifting columns and are in connection with a component of a height-adjustable table, a height-adjustable worktop or a height-adjustable bed. The lifting columns are arranged in the manner of a single drive, wherein the lifting columns comprise at least one spindle drive and at least one extensible lifting tube. They are arranged in each other in the manner of guide tubes in the case of an arrangement with several lifting tubes, and are mounted on each other with guide means and are guided among each other.

The safety device is known in the field as a pinch protector. It is intended to prevent body parts of persons or pets from being inadvertently pinched, which might lead to injuries. Since the adjustment devices for furniture are mass products, they should be producible at exceptionally low cost.

In the case of known safety devices, switching strips are used which are relatively expensive. Furthermore, such switching strips are disturbing. Safety devices are also installed in the drive unit or in the drive gear motor for the reasons as mentioned above. It is disadvantageous, however, that adjustment devices that are already in operation cannot be retrofitted.

The present disclosure provides for an electromotive adjustment device configured in such a way that the safety device can be arranged in a simple manner and can be produced at low cost. Such a safety device is arranged in such a way that electromotive adjustment devices which are already in operation can be retrofitted with the safety device according to embodiments of the present disclosure.

An embodiment of the present disclosure relates to a safety device comprising a light transmitter configured such that the generated light beam is directed against at least one furniture part to be adjusted or a further component which is in connection with this furniture part. The light beam impinging on the furniture part or the further component in connection with this furniture part will be reflected and will meet a light receiver. Electrical signals can, in accordance with the present disclosure, be generated in the case of a change in intensity of the reflected light caused by a deformation of the furniture part by a signal converter, so that after evaluation of the signals by control electronics of the control unit the drive gear motor can be shut down and/or reversed.

Thus, the safety device may, according to the present disclosure, be arranged as an optical system, so that by using a light transmitter and a light receiver the system will be very inexpensive, and that existing electromotive adjustment devices can also be retrofitted with this system. This optical system detects the deformation of a furniture part, for example, a table board, in a contactless manner. In this process, even the relatively low deformations occurring during pinching will be detected, so that this system can be regarded as a direct connection. Furthermore, this contactless and optical detection is independent of the material used.

It is advantageous, in accordance with the present disclosure, if the light transmitter and the light receiver are arranged in a housing which is coupled with the furniture part to be adjusted. It is advantageous, in accordance with the present disclosure, if the light transmitter and the light receiver are installed in the housing of the control unit, since this very much simplifies the retrofitting capability of existing electromotive adjustment devices.

Appropriately, in accordance with the present disclosure, the mutually facing areas of the housing and the furniture part are spaced from one another at a relatively low distance. This distance can be in the range of 1 mm, for example, so that even exceptionally slight deformations of the furniture part in the case of pinching, will be registered and can be evaluated. This distance can, for example, also be changed by a respective adjustment feature. If the light transmitter and the light receiver are arranged in the control housing for controlling the electromotive adjustment device, the signal transmission paths are respectively short. In this case, the housing is to be provided with the respective openings for the light beams. Then, the light transmitter and the light receiver can also, in accordance with the present disclosure, be arranged in the region of the printed circuit board for controlling the electromotive adjustment device. The embodiment in accordance with the present disclosure is suitable, for example, if the furniture part to be adjusted is a table board which can be adjusted by a lifting column. However, if the furniture part or the table board is adjusted by several lifting columns, it is advantageous, in accordance with the present disclosure, when the light transmitter and the light receiver are installed in a separate housing or in a further separate housing, since in this case a deformation of the furniture part can exclusively be recognized between the columns. In another embodiment according to the present disclosure, in which the table board is adjusted by two lifting columns, the light transmitter and the light receiver are arranged in the region between the lifting columns or in the region adjacent to the lifting columns, with the light transmitter and the light receiver being arranged in or on the housing of the control of the electromotive adjustment device.

In the case of a table which includes two table boards which are arranged and connected at an angle with respect to each other or which includes an angular or an arc-shaped table board, there can, according to the present disclosure, be more than two lifting columns which are arranged at a distance from one another. A first arrangement of light transmitter and light receiver can be fastened, for example, in the control housing under the one table board, wherein a second arrangement of light transmitter and light receiver is fastened in a separate housing under the other table board and/or under another table board section, which are in connection via a connecting cable or wireless connection with the control unit in the control housing.

The light beams can, for example, be of known types such as coherent, polarizing, pulsating, visible, infrared and the like. Alternatively, in accordance with the present disclosure, the light waves can also be transmitted by optical waveguides.

The connections between the housing and the furniture part are spaced relatively far from one another. Thereby, the registration of the deformation will become especially precise.

It is within the scope of the present disclosure, that the respective angle enclosed by the two light beams, in relation to the surface of the furniture part to be adjusted they are facing, is a relatively small acute angle, so that the entire system can respond in an especially sensitive way. This angle could lie in the range of 35°, for example, and can, for example, lie in a range of 15° to 50°, according to other embodiments of the present disclosure.

It is advantageous, according to the present disclosure, if the signals generated by the light receiver can be converted into electrical signals by the signal converter, and if the signals can be supplied to the control electronics of the control unit.

It is provided in a further embodiment according to the present disclosure that the signals generated are filtered in such a way that the system will only respond if a specific continuity is given. That is, the system will not respond in the case of a sudden deformation caused by a respective action of force. Such an action of force would occur, for example, if an object is placed from a specific height without any restraint and thereby an initially pulse-like signal is converted in the signal chain by a series-connected filter into a filtered signal, which is then supplied to the control electronics of the control unit. The filtering of the signals is done by a generally known bandpass filter. Depending on the type of configuration of the filter, slow and/or rapid changes of the signal can be filtered out. The limiting frequency of the respective filter can be adjusted in a known manner and is adjusted to the adjustment speed of the piece of furniture. In the case of an adjustable piece of furniture with a relatively high adjustment speed, at least one filter is provided which has at least one relatively low limiting frequency.

In accordance with the present disclosure, the light beam is guided through light guide channels in order to prevent scattering of the light beams.

In accordance with the present disclosure, the light transmitter is a infrared diode and the light receiver is a infrared transistor.

In an embodiment of the present disclosure, the furniture part to be adjusted is a table board to be adjusted by at least one lifting column. Tables are also known which are designated as so-called angular combinations and are provided with two table boards. Two of the systems which were described above will then become necessary.

It is sufficient, according to the present disclosure, if one light receiver and one light transmitter are used for determining the deformation of the furniture part. However, it is also, within the scope of the present disclosure, that several light transmitters and light receivers are used.

In an embodiment according to the present disclosure, the generated light beam is directed directly against the furniture part or directly against the table board. In another embodiment according to the present disclosure, a further component is coupled with the furniture part which follows the movement and the deformation of the furniture part or the table board, wherein a glued on element, a sticker, a reflection film, a reflector or the like may be used as the further component.

Furthermore, in accordance with the present disclosure, an apparatus is further provided for adjusting the light intensity, which is at least connected to the light transmitter or to the control unit. The light intensity of the emitting light transmitter adjusts to the intensity of the light received. As a result, the safety device can advantageously be brought in connection with a plurality of surfaces which reflect with different intensities. If, for example, the safety device is brought in connection with a low-reflection surface, an electronic control and evaluation system, which is in connection with the light receiver, will recognize an averagely weak signal of the light receiver and will change the intensity of the light-transmitting signal until the signal has assumed a predetermined average value on the light receiver. This automatic change occurs very slowly from a time point of view. Notice must be taken in this connection that, for the recognition of a case of pinching, it is not the light intensity on the receiver that is relevant but its change, and especially its rapid and/or sudden or rapidly progressing change in form of the change velocity, which can be filtered out by the aforementioned filter from the signal curve of the light receiver.

As described above, the light transmitter and the light receiver are arranged in a housing. A support is provided in accordance with an advantageous embodiment of the present disclosure. That support can be designated as a kind of detector support and which can also be arranged, in an embodiment according to the present disclosure, as a housing. This concerns an element or a number of elements on which the light transmitter and/or the light receiver can be fixed or mounted. In an embodiment of the detector support according to the present disclosure, the detector support includes, two mirrored components with recesses in the shape of shells, which at least form the light guide channels and/or the receivers for the light transmitter and/or the light receiver. In accordance with an embodiment of the present disclosure, the detector support includes at least one body and can, for example, be sealed with a cover, in accordance with an embodiment of the present disclosure. The detector support can, advantageously, include the light guide channels and the receivers for the light transmitter and/or the light receiver in such a way that the light transmitter and/or the light receiver together with the detector support mounted in this way form a pre-mounted component. That is so that the light transmitter and the light receiver are aligned and arranged at a predetermined distance from one another. The detector unit thus formed can then be inserted and mounted into a housing in form of a control housing, a manual switch housing or a separate housing.

Other aspects of the present disclosure will become apparent from the following descriptions when considered in conjunction with the accompanying drawings.

BRIEF DESCRIPTION OF THE DRAWINGS

FIG. 1 shows a schematic view of an optical system of an electromotive adjustment device, in accordance with the present disclosure.

DETAILED DESCRIPTION

The optical system of the present disclosure is explained by reference to FIG. 1 in which a furniture part to be adjusted is a table board 10. The table board 10 is shown in FIG. 1. A housing 11 is fixed to a bottom side of the table board 10. The housing 11 can, for example, be the housing of the control unit 19 or may be a separate housing. If the piece of furniture is an angular combination, a housing 11 is arranged beneath every table board 10 or under each table board section in the case, for example, of angular or arc-shaped table boards. A light transmitter, in form of an infrared diode 12, is arranged on the housing 11 in a region facing away from the table board 10. A light receiver, in form of an infrared photo transistor 13, is installed at the same level and at a distance therefrom. FIG. 1 shows that the housing 11 is disposed at a relatively small distance from the bottom side of the table board 10. This distance lies in the range of 1 mm, for example. The housing 11 is provided with two light guide channels 14, 15 which are disposed at an obtuse angle with respect to one another. The infrared diode 12 and the infrared photo transistor 13 are installed on the sides facing away from the table board 10. The light beam emitted by the infrared diode 12 impinges on the bottom side of the table board 10, and will be reflected there and received by the infrared photo transistor 13. The angle enclosed by a surface of the housing 11 facing the table board 10 and the light guide channels 14, 15 is a relatively small acute angle, for example, in the range of 20°. The angle is arranged as an acute angle, which, advantageously, strongly increases the sensitivity of the optical system.

If a pinching process, for example of a body part, occurs during an adjusting process of the furniture part, which is shown as the table board 10, the table board 10 will be deformed, with the deformation not being visible. The light intensity will change as a result of the sensitivity of the optical system by the rapid or the suddenly changed reflection of the light beams. This change will be converted by a signal converter into electrical signals, so that the drive gear motor 18 will either be shut down or changed over quickly. That is, the direction of rotation will be changed, by the control electronics of the control unit.

The signals will be filtered, for example, by a bandpass filter, so that the system will only initiate the shutdown or the reversal of the drive gear motor 18 when a change occurs after a continuity, for example, if there is a rapid or sudden change. However, if the table board 10 is loaded suddenly, that is, by placing a relatively heavy object thereon, a pulse-like signal will be present in the signal chain which will be filtered out by a bandpass filter and the system will not respond.

The gear of the drive gear motor 18 may be a speed reduction gear, such as a worm drive. The drive motor of the drive gear motor 18 may be a DC motor driven with a safe DC voltage. The drive unit 17 that is driven by the drive gear motor 18 may be a spindle drive. In a first example, the spindle may be rotatably drivable. A spindle nut may be placed thereon and be secured against rotation. The spindle nut is contemplated to be displaceable in the longitudinal direction of the spindle when the drive gear motor 18 is activated. In a second example, the spindle is secured against rotation and is displaceable in the longitudinal direction. Here, the spindle nut is rotated.

The output member 16 of the drive unit 17 is contemplated to be rigidly connected with the linearly moveable gear component. The output member 16 may be a lifting tube, for example, including a fork head at the free end. If so configured, the output member 16 may be connected in an articulated manner to the furniture part to be adjusted. Alternatively, the output member 16 may be connected to an adjustable fitting. Other arrangements also are contemplated, as noted herein.

The control device 19 is contemplated to operate the gear motor 18 based on inputs received from the operation of the light transmitter 12 and the light receiver 13. In one contemplated example, the electronics of the control device 19 evaluate signals generated when there is a change in intensity of the reflected light so that the control device 19 shuts down or reverses the drive gear motor 18.

Other embodiments are within the scope of the present disclosure but those embodiments will include at least one light transmitter 12 and a respective number of light receivers 13 will have been installed in a housing 11.

In embodiments according to the present disclosure, surfaces which have a reflection capability which does not produce a sufficiently active effect with the light transmitter and the light receiver, the surface section which is used for reflection can, for example, be provided with a suitable reflecting film, for example, a self-adhesive film.

An advantage of a preset distance between the table board 10 and the housing Ills discussed below. The housing 11 will be held at a fixed distance of 1 to 5 mm, for example, from the table board 10. That is accomplished, in an embodiment of the present disclosure, by attached spacers, and in another embodiment by spacers integrally attached to the housing 11, and in another embodiment by a housing shaped in an arched or curved manner. The spacers are arranged in the region of the screw-in points and the fastening screws so that the housing 11 rests on the table board 10 in the region of the fastening points, by which the housing 11 is screwed onto the piece of furniture, the furniture part or the table board 10. The free ends of the light guide channels 14, 15, which are defined in such a way that they are arranged to be opposite of the light transmitter 12 or the light receiver 13, are arranged as far away as possible from the screw-in points. For example, in accordance with the present disclosure, the distance between the table board 10 and the housing 11 changes more strongly in case of a deformation of the table board 10 that is close to the screw-in points. Thus, the measuring sensitivity will be increased advantageously in the case of an arrangement of the light guide channels 14, 15 with increasing distance from the screw-in points. The housing 11 is arranged in a relatively deformation-proof manner, that is, it offers higher deformation stiffness than the table board 10.

Although the present disclosure has been described and illustrated in detail, it is to be clearly understood that this is done by way of illustration and example only and is not to be taken by way of limitation. The scope of the present disclosure is to be limited only by the terms of the appended claims.

I claim:

1. An electromotive adjustment device for a piece of furniture having an adjustable furniture part, the electromotive adjustment device comprising:
   a housing;
   a drive gear motor;
   a control device having a device housing;
   at least one drive unit having an output member connected to the adjustable furniture part;
   the drive gear motor configured to be one of brought to a standstill and reversed by a safety device during the occurrence of a pinching between two furniture parts, a furniture part and a component of a piece of furniture, or a furniture part and a part of a body part; and
   wherein the safety device includes a light transmitter configured such that a light beam directed against one of the adjustable furniture part and the component and the light beam is reflected to meet a light receiver whereby electrical signals are generated by a signal converter when there is a change in reflected light intensity caused by a deformation of the adjustable furniture part, and after evaluation of the electrical signals by the control device, the drive gear motor is one of shut down and reversed.

2. The electromotive adjustment device according to claim 1, wherein the light transmitter and the light receiver are arranged within the housing which housing is coupled with the adjustable furniture part.

3. The electromotive adjustment device according to claim 1, further comprising two light guide channels which are disposed in the housing at an obtuse angle with respect to one another.

4. The electromotive adjustment device according to claim 3, further comprising a support that includes one or more of the light guide channels, the light transmitter and the light receiver.

5. The electromotive adjustment device according to claim 4, wherein the support forms a pre-mounted component in such a way that the light transmitter and the light receiver are aligned and arranged at a predetermined distance from one another.

6. The electromotive adjustment device according to claim 5, wherein the support is configured to be mounted as a pre-mounted component in the housing.

7. The electromotive adjustment device according to claim 1, wherein the light transmitter and the light receiver are installed in a region of the control device.

8. The electromotive adjustment device according to claim 1, wherein the housing is held at a fixed distance by attached spacers from one of the adjustable furniture part and the component.

9. The electromotive adjustment device according to claim 8, wherein the spacers are arranged in a region of screw-in points of the housing.

10. The electromotive adjustment device according to claim 9, wherein free ends of the light guide channels, which are to be located opposite of one or both of the light transmitter and the light receiver, and are arranged at a large distance from the screw-in points.

11. The electromotive adjustment device according to claim 1, wherein the light beam is generated by the light transmitter and is one of a coherent, polarizing, pulsating, and visible light beam.

12. The electromotive adjustment device according to claim 11, wherein the transmission of the light beam occurs by an optical waveguide.

13. The electromotive adjustment device according to claim 1, wherein the housing is inherently dimensionally stable, and mutually facing surfaces of the adjustable furniture part and the housing are disposed at a small distance from one another.

14. The electromotive adjustment device according to claim 11, wherein the light beam generated by the light transmitter and received by the light receiver is disposed under an acute angle in relation to an associated surface of the adjustable furniture part.

15. The electromotive adjustment device according to claim 1, wherein the signals received by the light receiver are converted by the signal converter into the electrical signals, and the electrical signals are supplied to control electronics of the control device.

16. The electromotive adjustment device according to claim 15, wherein the signals are filtered, by bandpass filter.

17. The electromotive adjustment device according to claim 1, wherein the piece of furniture includes a table board including a combination of angular parts, and at least one light transmitter and at least one light receiver are associated with each angular part of the table board.

18. The electromotive adjustment device according to claim 1, wherein the light transmitter is an infrared diode and the light receiver is an infrared photo transistor.

19. The electromotive adjustment device according to claim 5, wherein the support is configured to be mounted as a pre-mounted component integrally arranged in the housing.

20. The electromotive adjustment device according to claim 1, wherein the housing is held by spacers integrally attached to the housing.

21. The electromotive adjustment device according to claim 1, wherein the housing is shaped as one of a curve and an arch.

22. The electromotive adjustment device according to claim 1, wherein the light beam is generated by the light transmitter and is an infrared light beam.

23. The electromotive adjustment device according to claim 1, wherein the housing is a separate housing or is the housing of the control device.

* * * * *